United States Patent
Kim

(10) Patent No.: US 10,692,938 B2
(45) Date of Patent: Jun. 23, 2020

(54) LIGHT EMITTING DISPLAY DEVICE SLOPED ELECTRODE

(71) Applicant: LG Display Co., Ltd., Seoul (KR)

(72) Inventor: Mi Na Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/595,423

(22) Filed: May 15, 2017

(65) Prior Publication Data

US 2018/0182827 A1    Jun. 28, 2018

(30) Foreign Application Priority Data

Dec. 27, 2016  (KR) .................. 10-2016-0179957

(51) Int. Cl.
| | | |
|---|---|---|
| *G09G 5/02* | (2006.01) | |
| *H01L 27/32* | (2006.01) | |
| *H01L 51/52* | (2006.01) | |
| *H01L 51/50* | (2006.01) | |

(52) U.S. Cl.
CPC ...... *H01L 27/3218* (2013.01); *H01L 27/3258* (2013.01); *H01L 27/3246* (2013.01); *H01L 51/5064* (2013.01); *H01L 51/5265* (2013.01); *H01L 51/5284* (2013.01)

(58) Field of Classification Search
CPC .................. H01L 27/3218; H01L 27/2374
USPC .......................................................... 345/694
See application file for complete search history.

(56) References Cited

U.S. PATENT DOCUMENTS

| | | | | |
|---|---|---|---|---|
| 2010/0109511 | A1* | 5/2010 | Kim .................... | H01L 27/3258 313/504 |
| 2012/0056531 | A1* | 3/2012 | Park .................... | H01L 51/5036 313/506 |
| 2013/0099258 | A1* | 4/2013 | Lim .................... | H01L 51/5209 257/88 |
| 2013/0222217 | A1* | 8/2013 | Shin ...................... | H01L 27/326 345/80 |
| 2014/0306198 | A1* | 10/2014 | Im ........................ | H01L 51/0013 257/40 |
| 2015/0001477 | A1* | 1/2015 | Namkung ........... | H01L 27/3258 257/40 |
| 2015/0123952 | A1* | 5/2015 | Kim .................... | G09G 3/3225 345/205 |
| 2016/0020430 | A1* | 1/2016 | Kim .................... | H01L 51/5271 257/40 |

* cited by examiner

*Primary Examiner* — Jonathan M Blancha
(74) *Attorney, Agent, or Firm* — Fenwick & West LLP

(57) ABSTRACT

Provided is an light emitting display device including a plurality of pixels on a substrate. Each of the plurality of pixels includes a first sub pixel extending in a first direction, a second sub pixel extending in the first direction, a third sub pixel extending in a second direction, and a first sub pixel of a pixel in a first row of a first column and a first sub pixel of a pixel in the first row of a second column display different colors.

5 Claims, 8 Drawing Sheets

LIGHT EMITTING DISPLAY DEVICE SLOPED ELECTRODE

CROSS-REFERENCE TO RELATED APPLICATIONS

This application claims the priority of Korean Patent Application No. 10-2016-0179957 filed on Dec. 27, 2016, in the Korean Intellectual Property Office, the disclosure of which is incorporated herein by reference.

BACKGROUND

Field

The present disclosure relates to an light emitting display device, and more particularly, to an organic light emitting display device in which a color coordinate asymmetry phenomenon according to a viewing angle is improved.

Description of the Related Art

An organic light emitting display device (OLED) is a self-light emitting display device. The organic light emitting display device is a display device using an organic light emitting diode which injects holes from an anode and electrons from a cathode into a light emitting layer and emits light when an exciton in which the injected holes and electrons are coupled falls from an excited state to a ground state.

The organic light emitting display device is classified into a top emission type, a bottom emission type, and a dual emission type depending on a direction of emitted light and is classified into a passive matrix type and an active matrix type depending on a driving method.

The organic light emitting display device does not use a separate light source unlike a liquid crystal display device (LCD) and thus, may be manufactured into a lightweight and thin form. Further, the organic light emitting display device is advantageous in terms of power consumption since it is driven with a low voltage. Also, the organic light emitting display device has improved color expression ability, a high response speed, a wide viewing angle, and a high contrast ratio (CR). Therefore, the organic light emitting display device has been researched as a next-generation display device.

SUMMARY

An organic light emitting display device includes a plurality of pixels formed of a plurality of sub pixels, on a substrate. Each pixel may be configured to include a thin film transistor, a first electrode (anode), a second electrode (cathode), and a light emitting unit including a plurality of organic light emitting layers emitting different color light between the first electrode and a second electrode.

For example, the organic light emitting layer includes a red light emitting layer which emits red light, a green light emitting layer which emits green light, and a blue light emitting layer which emits blue light. Each light emitting layer may be configured to be divided into a red sub pixel, a green sub pixel, and a blue sub pixel. A pattern of each of the light emitting layers may be deposited using a mask which is open for every sub pixel, for example, a fine metal mask (FMM).

In the organic light emitting display device, a thin film transistor is formed below a light emitting unit including an organic light emitting layer. The first electrode which is disposed above the thin film transistor of each sub pixel may be formed to have a slope with respect to the substrate due to a step of the thin film transistor.

In the case of an organic light emitting display device of the related art, sub pixels in a plurality of pixels which are adjacent to each other are disposed in the same position. Therefore, when the first electrodes of the red sub pixel and the green sub pixel are formed to have a slope with respect to the substrate due to a step below the light emitting unit as described above, white color sense may vary according to the viewing angle of a user at the time of representing the white by the organic light emitting display device.

More specifically, when the organic light emitting display device of the related art which displays white color is viewed from an upper side of the front, a reddish phenomenon in which white is slightly tinged with red is generated. Further, when the organic light emitting display device of the related art is viewed from a lower side of the front, a greenish phenomenon in which white is slightly tinged with green is generated. Therefore, an image quality failure in which the color sense of the organic light emitting display device varies according to the viewing angle of the user is generated.

Therefore, the inventors of the present disclosure recognized the above-mentioned problems and invented an organic light emitting display device which may reduce the image quality failure by improving a color coordinate asymmetry phenomenon according to a viewing angle.

Objects of the various embodiments of the present disclosure are not limited to the above-mentioned objects, and other objects, which are not mentioned above, can be clearly understood by those skilled in the art from the following descriptions.

According to an embodiment of the present disclosure, there is provided a light emitting display device. The light emitting display device includes a plurality of pixels on a substrate, in which each of the plurality of pixels may include a first sub pixel extending in a first direction, a second sub pixel extending in the first direction, and a third sub pixel extending in a second direction, and a first sub pixel of a pixel in a first row of a first column and a first sub pixel of a pixel in the first row of a second column may display different colors.

According to another embodiment of the present disclosure, there is provided a light emitting display device. The light emitting display device includes a substrate including a pixel array and pixels which include at least three sub pixels in the pixel array, in which among the three sub pixels, a blue sub pixel extends in a column direction and a red sub pixel and a green sub pixel extend in a row direction arranged in the column direction at the side of the blue sub pixel, an anode of the red sub pixel has a first slope with respect to the substrate and an anode of the green sub pixel has a second slope with respect to the substrate, the second slope having an opposite tilting direction with respect to the first slope.

According to yet another embodiment of the present disclosure, there is provided a light emitting display device. The light emitting display device includes a first pixel and a second pixel. The first pixel includes a first sub-pixel and a second sub-pixel. The first sub-pixel and the second sub-pixel are aligned and separated in a first direction. The first and second sub-pixels are elongated in a second direction. The second pixel is adjacent to the first pixel in a second direction, includes a third sub-pixel and a fourth sub-pixel. The third sub-pixel and the fourth sub-pixel are aligned in the first direction. The first sub-pixel and the third sub-pixel are aligned in the second directions. The second sub-pixel and the fourth sub-pixel are aligned in the second direction. The first sub-pixel and the third sub-pixel are configured to display different colors.

Other detailed matters of the embodiments are included in the detailed description and the drawings.

According to the organic light emitting display device according to the embodiment of the present disclosure, a tilting direction of a first electrode of the first sub pixel of the pixel in the first row of the first column is same to a tilting direction of a first electrode of the second sub pixel of the pixel in the first row of the second column. Therefore, fluctuation of the color coordinate according to the viewing angle may be reduced.

Further, according to the organic light emitting display device according to an embodiment of the present disclosure, first sub pixels and second sub pixels of two adjacent pixels are disposed to display different colors. Therefore, a color coordinate asymmetry phenomenon according to the viewing angle may be minimized and an image quality of the organic light emitting display device may be improved.

Objects of the present disclosure are not limited to the above-mentioned objects, and other objects, which are not mentioned above, can be clearly understood by those skilled in the art from the following descriptions.

The objects to be achieved by the present disclosure, the means for achieving the objects, and effects of the present disclosure described above do not specify essential features of the claims, and, thus, the scope of the claims is not limited to the disclosure of the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENTS

Figure 1:
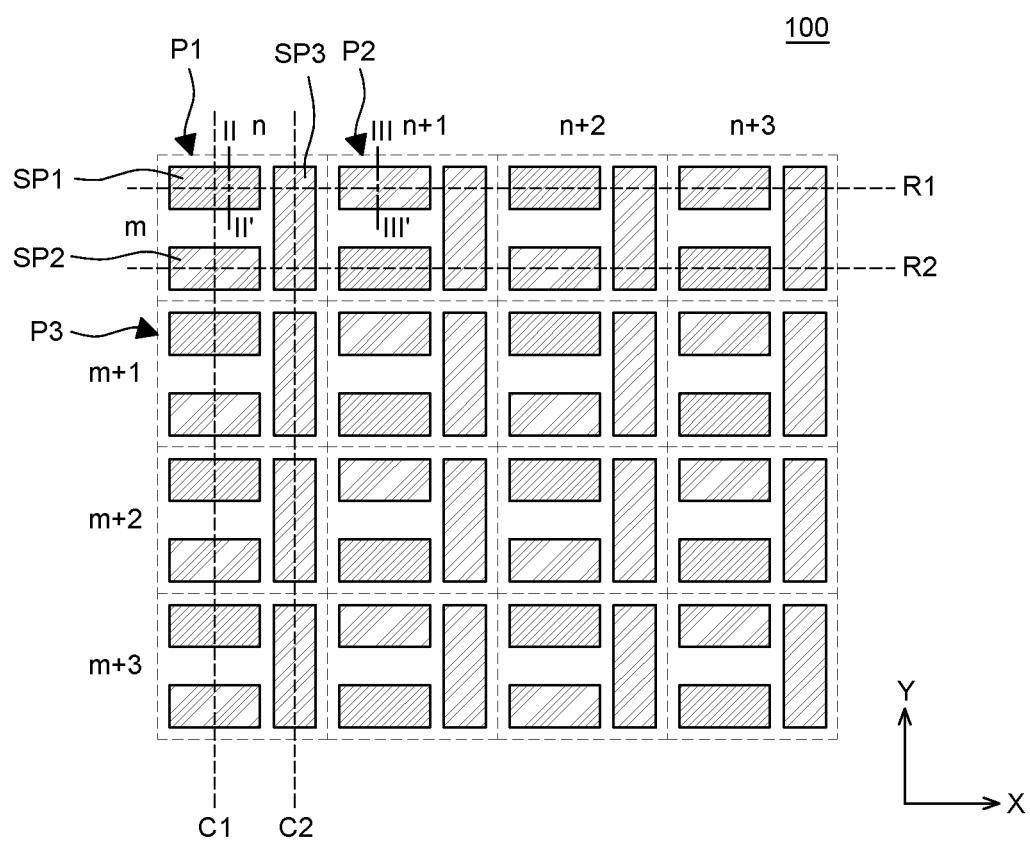
FIG. 1 is a view illustrating a pixel arrangement structure of an organic light emitting display device according to an embodiment of the present disclosure.

Advantages and characteristics of the present disclosure and a method of achieving the advantages and characteristics will be clear by referring to the embodiments described below in detail together with the accompanying drawings. However, the present disclosure is not limited to embodiment disclosed herein but will be implemented in various forms. The embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the various embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated. When the position relation between two parts is described using the terms such as "on", "above", "below", and "next", one or more parts may be positioned between the two parts unless the terms are used with the term "immediately" or "directly" is not used.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

The features of various embodiments of the present disclosure can be partially or entirely coupled to or combined with each other and can be interlocked and operated in technically various ways, and the embodiments can be carried out independently of or in association with each other.

Hereinafter, embodiments of the present disclosure will be described in detail with reference to the drawings.

FIG. 1 is a view illustrating a pixel arrangement structure of an organic light emitting display device according to an embodiment of the present disclosure.

Figure 2:
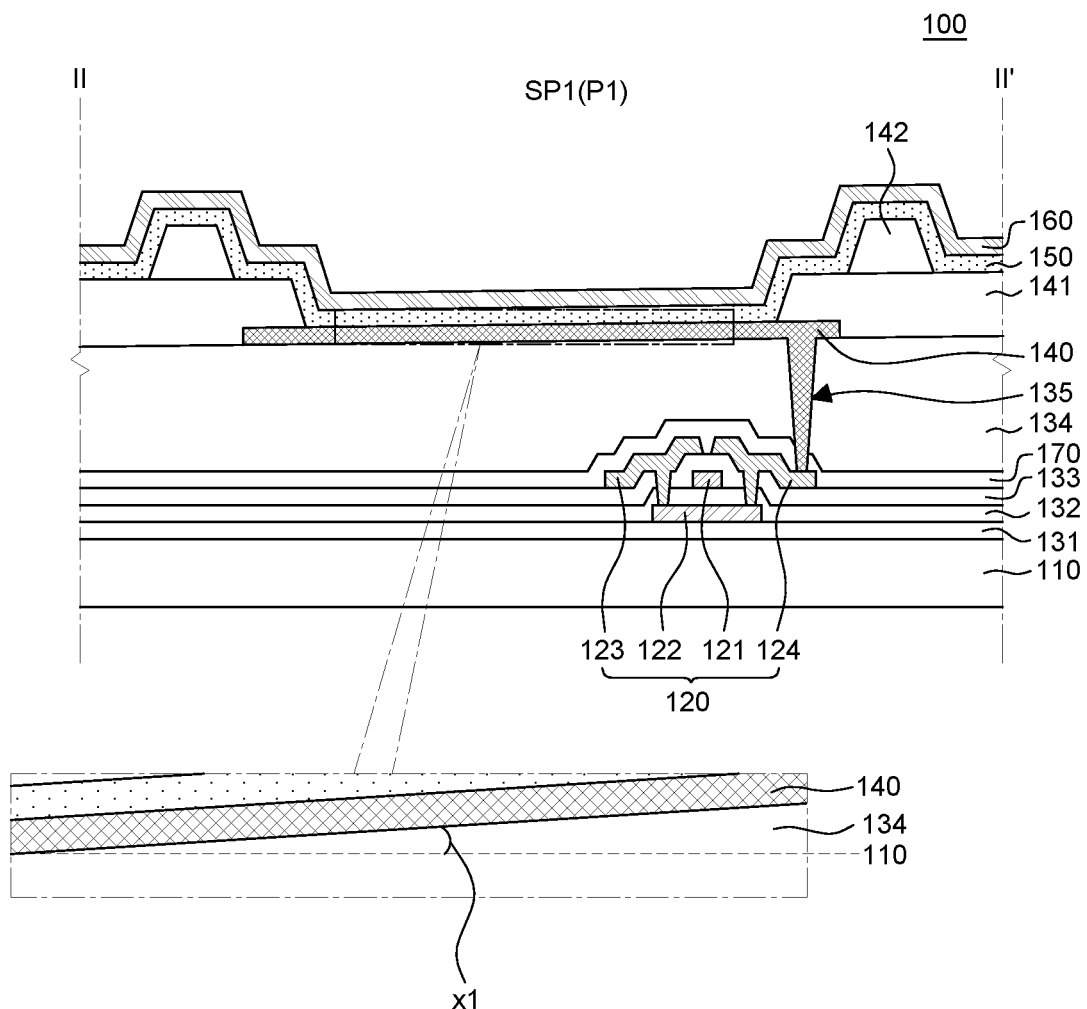
FIG. 2 is a cross-sectional view of the organic light emitting display device according to an embodiment of the present disclosure taken along the line II-II' in FIG. 1.

Further, FIG. 2 is a cross-sectional view of the organic light emitting display device according to an embodiment of the present disclosure taken along the line II-II' in FIG. 1.

Figure 3:
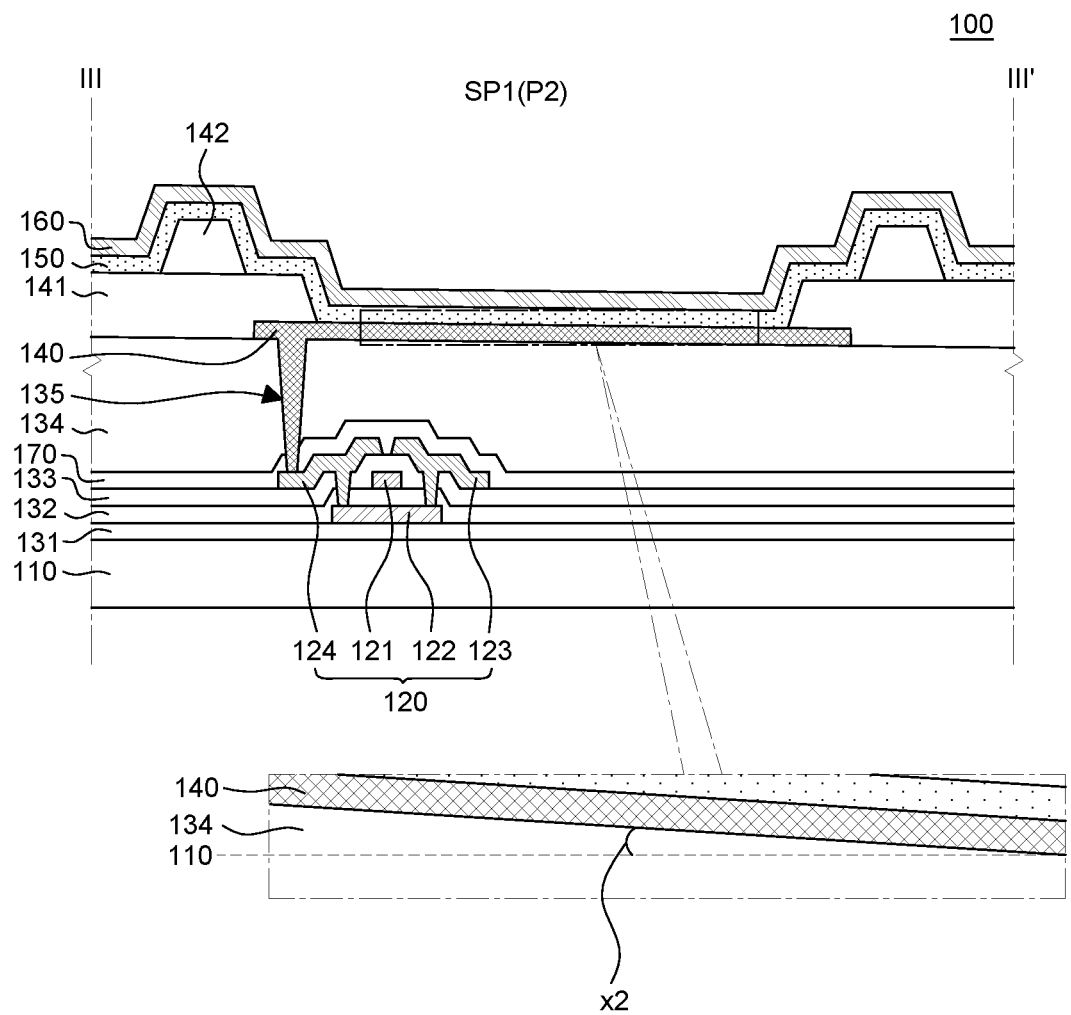
FIG. 3 is a cross-sectional view of the organic light emitting display device according to an embodiment of the present disclosure taken along the line III-III' in FIG. 1.

Further, FIG. 3 is a cross-sectional view of the organic light emitting display device according to an embodiment of the present disclosure taken along the line III-III' in FIG. 1.

Hereinafter, an organic light emitting display device according to an embodiment of the present disclosure will be described with reference to FIGS. 1 to 3.

Referring to FIG. 1, an organic light emitting display device 100 according to an embodiment of the present disclosure includes a plurality of sub pixels. The sub pixel refers to a minimum unit of an area where light is emitted. Furthermore, a plurality of sub pixels is gathered to form a minimum group of representing white light. For example, three sub pixels of a red sub pixel, a green sub pixel, and a blue sub pixel form one group. Alternatively, as one group, four sub pixels, for example, a red sub pixel, a green sub pixel, a blue sub pixel, and a white sub pixel may form one group. However, the present disclosure is not limited thereto and various sub pixel designs may be used.

More specifically, the organic light emitting display device 100 includes a plurality of pixels including a first pixel P1, a second pixel P2, and a third pixel P3 which are disposed on a substrate 110 in a matrix. Each pixel is configured to include a plurality of sub pixels formed of a first sub pixel SP1, a second sub pixel SP2, and a third sub pixel SP3.

Furthermore, the first sub pixel SP1, the second sub pixel SP2, and the third sub pixel SP3 which form each pixel may have a rectangular shape with a long side and a short side.

For example, in the first pixel P1, the first sub pixel SP1 is located at a left upper side of the first pixel P1 and extends in a first direction X which is the same direction as a direction where a gate line GL is formed. The second sub pixel SP2 is located at a left lower side of the first pixel P1 and extends in the first direction X which is the same direction as a direction where the gate line GL is formed. The third sub pixel SP3 is located to correspond to both a right upper side and a right lower side of the first pixel P1 and extends in a second direction Y which is the same direction as a direction where a data line DL is formed.

More specifically, the first sub pixel SP1 of the first pixel P1 is formed to extend from a intersecting portion of a first column corresponding to a C1 line in the first pixel P1 and a first row corresponding to a R1 line in the first pixel P1 to the first direction X which is a horizontal direction. The second sub pixel SP2 of the first pixel P1 is formed to extend from an intersecting portion of the first column corresponding to the C1 line in the first pixel P1 and a second row corresponding to a R2 line in the first pixel P1 to the first direction X which is the horizontal direction.

The third sub pixel SP3 of the first pixel P1 is formed to extend from an intersecting portion of the first row corresponding to the R1 line in the first pixel p1 and the second column corresponding to the C2 line in the first pixel P1 to an intersecting portion of the second row corresponding to the R2 line in the first pixel and the second column corresponding to the C2 line in the first pixel P1 in a second direction Y which is a vertical direction.

Furthermore, the first sub pixel SP1 of the organic light emitting display device 100 is a red sub pixel including a red light emitting layer, the second sub pixel SP2 is a green sub pixel including a green light emitting layer, and the third sub pixel SP3 is a blue sub pixel including a blue light emitting layer. However, the present disclosure is not limited thereto.

The organic light emitting display device 100 is configured such that the first sub pixel SP1 of the first pixel P1 in an m-th row of an n-th column and the first sub pixel SP1 of the second pixel P2 in an m-th row of an n+1-th column are different colors. Here, n and m are positive integers.

For example, when the first sub pixel SP1 of the first pixel P1 in the m-th row of the n-th column is a red sub pixel which displays a red color, the first sub pixel SP1 of the second pixel P2 in the m-th row of the n+1-th column may be a green sub pixel which displays a green color. Further, when the first sub pixel SP1 of the first pixel P1 in the m-th row of the n-th column is a green sub pixel which displays a green color, the first sub pixel SP1 of the second pixel P2 in the m-th row of the n+1-th column may be a red sub pixel which displays a red color.

Furthermore, the organic light emitting display device 100 is configured such that the first sub pixel SP1 of the first pixel P1 in an m-th row of an n-th column and the second sub pixel SP2 of the second pixel P2 in an m-th row of an n+1-th column display the same color.

Furthermore, the organic light emitting display device 100 is configured such that the second sub pixel SP2 of the first pixel P1 in the m-th row of the n-th column and the first sub pixel SP1 of the second pixel P2 in the m-th row of the n+1-th column adjacent display the same color.

That is, in the organic light emitting display device 100, the first sub pixel SP1 and the second sub pixel SP2 included in the first pixel P1 and the second pixel P2 which are disposed to be adjacent to each other in the first direction X which is a horizontal direction may be disposed to display different colors, respectively.

Furthermore, in the organic light emitting display device 100, the first sub pixel SP1 of the first pixel P1 and a first sub pixel SP1 of the third pixel P3 which are disposed to be adjacent to the first pixel P1 in the second direction Y which is perpendicular to the first direction X may be disposed to display the same color. Furthermore, the second sub pixel SP1 of the first pixel P1 and the second sub pixel SP2 of the third pixel P3 may be disposed to display the same color.

That is, the first pixel P1 in the m-th row of the n-th column and the second pixel P2 of the m-th row of the n+1-th column of the organic light emitting display device 100 form a pixel group and the pixel group is repeatedly disposed in the first direction X which is a horizontal direction and the second direction Y which is a vertical direction.

Referring to FIGS. 2 and 3, the organic light emitting display device 100 includes a substrate 110, a thin film transistor 120 disposed on the substrate 110, and a light emitting unit 150 which is disposed between a first electrode 140 and a second electrode 160 and includes a plurality of organic layers and organic light emitting layers EML.

FIG. 2 illustrates the first sub pixel SP1 of the first pixel P1 of FIG. 1 and FIG. 3 illustrates the first sub pixel SP1 of the second pixel P2 of FIG. 1.

In the organic light emitting display device 100, the substrate 110 is provided to support various components of the organic light emitting display device 100 and is formed of an insulating material. For example, the substrate 110 may be formed of not only glass, but also a plastic substrate such as polyethylene terephthalate (PET), polyethylene naphthalate (PEN), or polyimide. When the organic light emitting display device is a flexible organic light emitting display device, the substrate 110 may be formed of a flexible material such as plastic. Furthermore, when the organic light emitting diode which may implement flexibility is applied to an illumination device for a vehicle or an automotive display, various designs and a degree of freedom of a design of the illumination device for a vehicle may be used according to a structure or an exterior shape of the vehicle.

A buffer layer 131 may be formed on the substrate 110 to block penetration of impurities from the substrate 110 and the outside and protect various components of the organic light emitting display device 100. The buffer layer 131 may be formed of a structure of a single layer or a plurality of layers of a silicon oxide film (SiOx) or a silicon nitride film (SiNx), but is not limited thereto. The buffer layer 131 may be omitted depending on a structure or a characteristic of the organic light emitting display device 100.

A thin film transistor 120 which includes a semiconductor layer 122, a gate electrode 121, a source electrode 123, and a drain electrode 124 is formed on the buffer layer 131. Specifically, the semiconductor layer 122 is formed on the substrate 110 and a gate insulating layer 132 which insulates the semiconductor layer 122 from the gate electrode 121 is formed on the semiconductor layer 122. An interlayer insulating layer 133 which insulates the gate electrode 121 from the source electrode 123 and the drain electrode 124 is formed on the gate electrode 121. The source electrode 123 and the drain electrode 124 which are in contact with the semiconductor layer 122 respectively are formed on the interlayer insulating layer 133. The source electrode 123 or the drain electrode 124 is electrically connected to the semiconductor layer 122 through a contact hole.

The semiconductor layer 122 may be formed of amorphous silicon (a-Si), polycrystalline silicon (poly-Si), an oxide semiconductor, an organic semiconductor, or the like. When the semiconductor layer 122 is formed of an oxide semiconductor, the semiconductor layer 122 may be formed of any one of indium gallium zinc oxide (IGZO), zinc tin oxide (ZTO), indium zinc oxide (IZO), indium gallium oxide (IGO), and indium tin zinc oxide (ITZO), but is not limited thereto.

The gate insulating layer 132 may be formed of a structure of a single layer or a plurality of layers which is formed of an inorganic insulating material, such as a silicon oxide film (SiOx) or a silicon nitride film (SiNx), but is not limited thereto.

The gate electrode 121 performs a function of transmitting a gate signal to the thin film transistor 120. The gate electrode may be formed of at least one of aluminum (Al), molybdenum (Mo), titanium (Ti), and copper (Cu), or an alloy thereof and may be formed of a structure of a single layer or a plurality of layers of the above-mentioned metal or the alloy thereof, but is not limited thereto.

The source electrode 123 and the drain electrode 124 serves to transmit an electric signal transmitted from the outside from the thin film transistor 120 to the light emitting unit 150. The source electrode 123 and the drain electrode 124 may be formed of at least one of aluminum (Al), molybdenum (Mo), titanium (Ti), and copper (Cu), or an alloy thereof and may be formed of a structure of a single layer or a plurality of layers of the above-mentioned metal or the alloy thereof, but is not limited thereto.

In this specification, for the convenience of description, among various thin film transistors which may be included in the organic light emitting display device 100, only a driving thin film transistor 120 which is connected to the first electrode 140 is illustrated. Each sub pixel may further include a switching thin film transistor or a capacitor.

A protective layer 170 is formed on the thin film transistor 120. The protective layer 170 may be formed of an inorganic insulating material. For example, the protective layer 170 may be formed of a silicon oxide film (SiOx) or a silicon nitride layer (SiNx), but is not limited thereto. The protective layer 170 may be omitted depending on a structure or a characteristic of the organic light emitting display device 100.

A over coating layer 134 is formed on the protective layer 170. The over coating layer 134 may be formed on the protective layer 170 to serve as an additional protective layer and serves to planarize components such as the thin film transistor 120 on the substrate 110. The over coating layer 134 may be configured by a single layer or a plurality of layers and may be formed of an organic material. For example, the over coating layer 134 may be formed of polyimide, photoacryl, or benzocyclobotene (BCB), but is not limited thereto.

The protective layer 170 and the over coating layer 134 include a contact hole 135 through which the thin film transistor 120 and the first electrode 130 are electrically connected to each other in each sub pixel.

A first electrode 140 is formed on the over coating layer 134. The first electrode 140 may be an anode and is formed of a conductive material having a high work function value to supply holes to the organic light emitting layer of the light emitting unit 150. The first electrode 140 is electrically connected to the thin film transistor 120 through the contact hole 135 provided on the protective layer 170 and the over coating layer 134, and for example, may be electrically connected to the source electrode 123 of the thin film transistor 120. Furthermore, the first electrodes 140 are disposed to be spaced apart from each other for every sub pixel. The first electrode 140 is formed of a transparent conductive material, and for example, may be formed of a material such as indium tin oxide (ITO) or indium zinc oxide (IZO), but is not limited thereto.

Furthermore, when the organic light emitting display device 100 is a top emission type, a reflective layer which is formed of a metal material having good reflection efficiency may be formed. For example, the reflective layer formed of a material such as aluminum (Al) or silver (Ag) may be further formed above or below the first electrode 140 so that light emitted from the organic light emitting layer of the light emitting unit 150 is reflected from the first electrode 140 to be more smoothly upwardly emitted.

For example, the first electrode 140 may have a double layered structure in which a transparent conductive layer formed of a transparent conductive material and the reflective layer are sequentially laminated or a triple layered structure in which a first transparent conductive layer, the reflective layer, and a second transparent conductive layer are sequentially laminated. The reflective layer may be silver (Ag) or an alloy including silver, for example, silver (Ag) or APC (Ag/Pd/Cu).

In the description of the organic light emitting display device 100, a top emission type refers to a method that light emitted from the organic light emitting layer of the light emitting unit 150 is emitted toward the second electrode 160. Further, a bottom emission type refers to a method that light is emitted toward the first electrode 140 which is an opposite direction to the top emission type.

Referring to FIGS. 2 and 3, the organic light emitting display device 100 may include a bank layer 141 which at least partially covers the first electrode 140 and is formed on the over coating layer 134 and a spacer 142 formed on the bank layer 141.

The bank layer 141 is disposed at a periphery of the first electrode 140 to define an emission area of the light emitting unit 150 of the organic light emitting display device. That is, the bank layer 141 divides adjacent sub pixels and is disposed on one side of the first electrode 140 to expose a part of the first electrode 140. Furthermore, the spacer 142 maintains a distance between a mask and the bank layer during a deposition process of a plurality of organic layers or organic light emitting layers EML configured in the light emitting unit 150 or a formation process of the second electrode 160 on the light emitting unit 150, thereby reducing the likelihood of a failure caused by the contact with the mask.

The bank layer 141 and the spacer 142 of the organic light emitting display device 100 may be formed of a transparent material and the bank layer 141 and the spacer 142 may be formed of the same material. For example, the bank layer 141 and the spacer 142 may be formed of any one of polyimide, photoacryl, and benzocyclobutene (BCB).

When the bank layer 141 and the spacer 142 are formed of a transparent material, light entering from the outside transmits through the transparent bank layer 141 and spacer 142 to be reflected from the first electrode 140 which is located below the bank layer 141 and the spacer 142 and includes a layer formed of a metal material. Therefore, there may be a problem in that the reflection due to the external light may be generated in the organic light emitting display device 100. Furthermore, when the organic light emitting display device 100 is applied to the automotive display, it is difficult to apply the organic light emitting display device to the automotive display due to the reflection by the external light. Therefore, in order to reduce reflection due to the external light of the organic light emitting display device, the bank layer 141 and the spacer 142 of the organic light emitting display device 100 may be formed of a material including a black pigment. That is, a photoresist for forming the bank layer 141 and the spacer 142 may be configured by a material including a black pigment. The black pigment may be configured by an organic material or an inorganic material.

The black pigment may be configured by a carbon based material, metal oxide, or the like. Further, the photoresist may include photosensitive compounds including at least one of polymer, monomer, and a photoinitiator. Furthermore, the photoresist may include a solvent which disperses the photosensitive compounds.

The bank layer 141 and the spacer 142 of the organic light emitting display device 100 may be simultaneously formed by a halftone process using a halftone mask.

The halftone mask is a mask including a light shielding unit, a light transmitting unit, and a semi-light transmitting unit. The light shielding unit is a portion which blocks the light, the light transmitting unit is a portion through which the light is transmitted, and the semi-light transmitting unit is a portion in which an amount of transmitted light is smaller than that of the light transmitting unit. When the halftone mask is used, an amount of light is differently applied at the time of exposure so that patterns having different heights may be simultaneously formed.

The bank layer 141 and the spacer 142 of the organic light emitting display device 100 may be simultaneously patterned to be formed by the halftone process using one mask. Therefore, the manufacturing process of the organic light emitting display device may be simplified.

The light emitting unit 150 is formed on the first electrode 140, the bank layer 141, and the spacer 142. If necessary, the light emitting unit 150 may include various organic layers and also includes the organic light emitting layer EML. Furthermore, the light emitting unit 150 may include a plurality of organic light emitting layers depending on a structure of the organic light emitting display device. The organic layer may include at least one hole transporting layer HTL and electron transporting layer ETL. The organic layer may further include a functioning layer such as a hole injecting layer HIL, an electron injecting layer EIL, a hole blocking layer HBL, and an electron blocking layer EBL. Furthermore, the plurality of organic layers included in the light emitting unit 150 may have a common layer structure so as to correspond to all a red sub pixel R, a green sub pixel G, and a blue sub pixel B.

A second electrode 160 is formed on the light emitting unit 150. The second electrode 160 may be a cathode. Since the second electrode 160 supplies electrons to the organic light emitting layer, the second electrode is formed of a conductive material having a low work function. More specifically, the second electrode 160 may be a metal material such as magnesium (Mg) or silver-magnesium (Ag:Mg), but is not limited thereto.

Further, when the organic light emitting display device 100 is a top emission type, the second electrode 160 may be formed of indium tin oxide (ITO), indium zinc oxide (IZO), indium tin zinc oxide (ITZO), zinc oxide (ZnO), and tin oxide (TiO) based transparent conductive oxide, but is not limited thereto.

A cross-sectional structure in a second direction Y, which is a vertical direction, of the first sub pixel SP1 of the first pixel P1 of the organic light emitting display device 100 will be described with reference to FIG. 2. In the organic light emitting display device 100, the first electrode 140 which is disposed on the over coating layer 134 of the first sub pixel SP1 may be formed to have a first slope at an angle x1 with respect to the substrate 110, due to a step of the thin film transistor 120 disposed below the light emitting unit 150 including the organic light emitting layer.

The first sub pixel SP1 of the first pixel P1 may be a red sub pixel including a red light emitting layer. Furthermore, the first electrode 140 of the first sub pixel SP1 of the first pixel P1 may be formed to be inclined toward an upper direction of the organic light emitting display device 100.

A cross-sectional structure in a second direction, which is a vertical direction, of the first sub pixel SP1 of the second pixel P2 of the organic light emitting display device 100 will be described with reference to FIG. 3. In the organic light emitting display device 100, the first electrode 140 which is disposed on the over coating layer 134 of the first sub pixel SP1 of the second pixel P2 may be formed to have a second slope at an angle x2 with respect to the substrate 110, due to the step of the thin film transistor 120 disposed below the light emitting unit 150 including the organic light emitting layer.

The first sub pixel SP1 of the second pixel P2 may be a green sub pixel including a green light emitting layer. Furthermore, the first electrode 140 of the first sub pixel SP1 of the second pixel P2 may be formed to be inclined toward a lower direction of the organic light emitting display device 100.

In the organic light emitting display device 100, the thin film transistors 120 of the sub pixels which display the same color may have the same structure. Furthermore, in the case of the sub pixels which display the same color, the first electrode 140 may be formed to have the same direction and the same angle with respect to the substrate 110.

More specifically, the red sub pixels which are the first sub pixels SP1 of the organic light emitting display device 100 may be formed to be inclined with the first slope at an angle x1 with respect to the substrate to be directed to the upper direction of the organic light emitting display device 100. Further, the green sub pixels which are the second sub pixels SP2 may be formed to be inclined with the second slope at an angle x2 to be directed to the lower direction of the organic light emitting display device 100.

That is, referring to FIGS. 1 to 3, the organic light emitting display device 100 may be formed such that an angle formed by the substrate 110 and the first electrode 140 of a pixel in the m-th row of the n-th column, that is, the first sub pixel SP1 of the first pixel P1 and an angle formed by the substrate 110 and the first electrode 140 of a pixel in the m-th row of the n+1-th column, that is, the first sub pixel SP1 of the second pixel P2 are different from each other.

Further, the organic light emitting display device 100 may be formed such that an angle formed by the substrate 110 and the first electrode 140 of the pixel in the m-th row of the n-th column, that is, the first sub pixel SP1 of the first pixel P1 and an angle formed by the substrate 110 and the first electrode 140 of the pixel in the m-th row of the n+1-th column, that is, the second sub pixel SP2 of the second pixel P2 are the same.

Furthermore, in the first pixel P1 and the third pixel P3 disposed to be adjacent to the first pixel P1 in the second direction Y which is perpendicular to the first direction X, an angle formed by the substrate 110 and the first electrode 140 of the pixel in the m-th row of the n-th column, that is, the second sub pixel SP2 of the first pixel P1 and an angle formed by the substrate 110 and the first electrode 140 of the pixel in the m+1-th row of the n-th column, that is, the first sub pixel SP1 of the third pixel P3 are different from each other.

In the case of an organic light emitting display device of the related art, sub pixels in a plurality of pixels which are adjacent to each other are disposed in the same position. Therefore, when the first electrodes of the red sub pixel and the green sub pixel are formed to have a slope with respect to the substrate due to a step below the light emitting unit as described above, white color sense may vary according to the viewing angle of a user at the time of representing the white by the organic light emitting display device.

More specifically, when the organic light emitting display device of the related art which displays white color is viewed from an upper side of the front, a reddish phenomenon in which white is slightly tinged with red is generated. Further, when the organic light emitting display device of the related art is viewed from a lower side of the front, a greenish phenomenon in which white is slightly tinged with green is generated. Therefore, an image quality failure in which the color sense of the organic light emitting display device varies according to the viewing angle of the user is generated.

Referring back to FIGS. 1-3, according to the organic light emitting display device 100 of the present disclosure, a first sub pixel SP1 and a second sub pixel SP2 of two pixels which are adjacent to each other in the first direction X which is a horizontal direction are disposed to display different colors. That is, the first sub pixel SP1 and the second sub pixel SP2 in every pixel display different colors and the first sub pixel SP1 and the second sub pixel SP2 are alternately disposed to have different angles formed by the first electrode 140 of the first sub pixel SP1 and the second sub pixel SP2 and the substrate 110. Therefore, an asymmetry phenomenon of color sense at a specific viewing angle caused when angles of the first electrodes displaying the same color are disposed in the same direction in the organic light emitting display device of the related art may be reduced.

That is, in the organic light emitting display device 100, the angle formed by the first electrode 140 and the substrate 110 in the first sub pixel SP1 of the first pixel P1 is different from the angle formed by the first electrode 140 and the substrate 110 in the first sub pixel SP1 of the second pixel P2 which is adjacent to the first pixel P1 in a horizontal direction, so that a variation of the color coordinate according to the viewing angle may be reduced as compared with the organic light emitting display device of the related art.

Furthermore, according to the organic light emitting display device 100, first sub pixels SP1 and second sub pixels SP2 of two adjacent pixels P1 and P2 are disposed to display different colors so that a color coordinate asymmetry phenomenon according to the viewing angle may be reduced and an image quality of the organic light emitting display device may be improved.

As described above, in addition to a method of reducing a color coordinate asymmetry phenomenon according to the viewing angle by alternately disposing the first sub pixels and the second sub pixels of two pixels which are adjacent to each other in the horizontal direction to display different colors, a method of forming structures of thin film transistors disposed below the first electrode of the first sub pixel and the second sub pixel to have the same step, a method of disposing a bank layer which defines the first sub pixel and the second sub pixel to be moved to a position where a lower step is reduced, a method of improving planarization of the thin film transistor by changing a processing condition such as a ratio, a thickness, and a curing temperature of the over coating layer, and a method of changing the pixel structure by adding a sub pixel to the first sub pixel, the second sub pixel, and the third sub pixel may be applied.

Furthermore, when the organic light emitting display device 100 is applied to an augmented reality (AR) device and a virtual reality (VR) device which use an organic light emitting display device with a high resolution, a color coordinate asymmetry phenomenon according to a viewing angle which may be caused as the resolution of the organic light emitting display device becomes 1000 PPI (pixel per inch) or higher may be reduced. Furthermore, the image quality of the organic light emitting display device may be advantageously improved.

Figure 4:
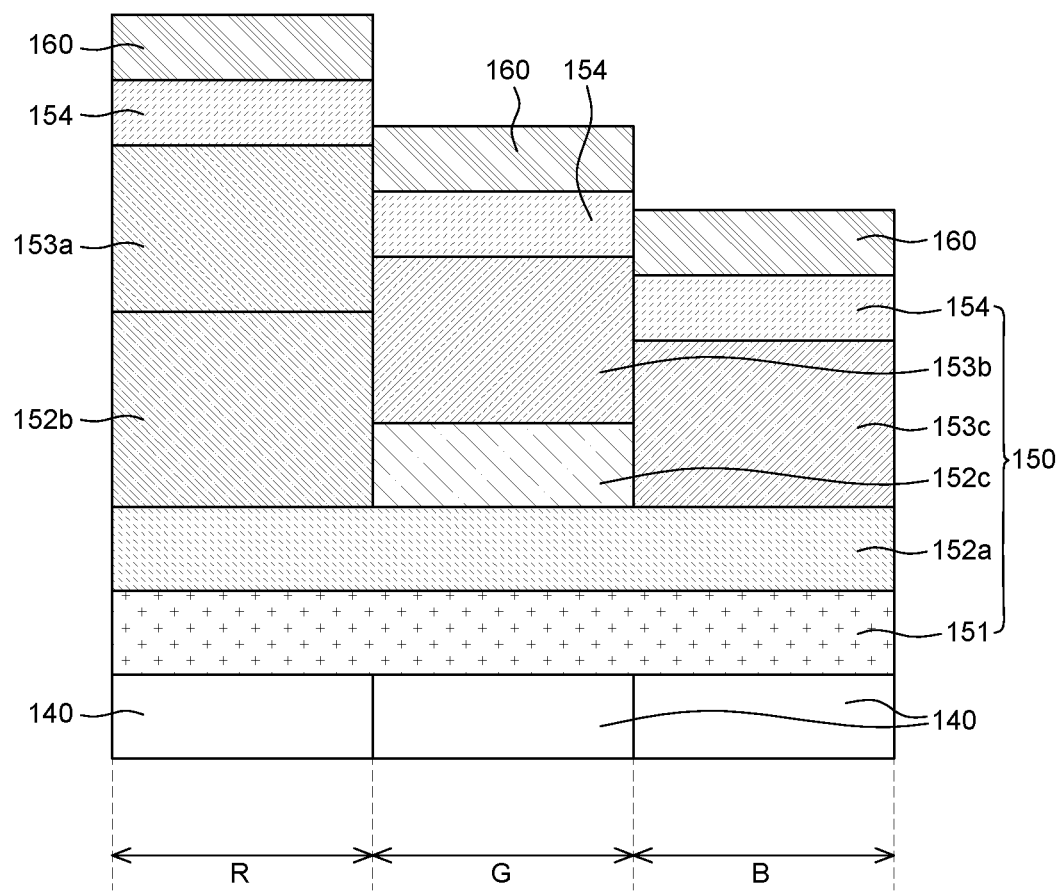
FIG. 4 is a view illustrating a cross-sectional structure of a light emitting unit of an organic light emitting display device according to an embodiment of the present disclosure.

FIG. 4 is a view illustrating a cross-sectional structure of a light emitting unit of an organic light emitting display device according to an embodiment of the present disclosure.

The light emitting unit 150 of the organic light emitting display device 100 will be described in more detail with reference to FIG. 4.

The light emitting unit 150 of the organic light emitting display device 100 includes a hole injecting layer (HIL) 151 disposed on the first electrode 140, a first hole transporting layer (1st HTL) 152a disposed on the hole injecting layer 151, a second hole transporting layer (2nd HTL) 152b and a third hole transporting layer (3rd HTL) 152c disposed on the first hole transporting layer 152a, an organic light emitting layer (EML) including a red light emitting layer 153a, a green light emitting layer 153b, and a blue light emitting layer 153c disposed on the hole transporting layers 152a, 152b, and 152c, and an electron transporting layer (ETL) 154 disposed on the organic light emitting layer.

The first electrode 140 is disposed on the over coating layer 134 so as to correspond to the red sub pixel R, the green sub pixel G, and the blue sub pixel B defined on the substrate.

The hole injecting layer 151 is disposed on the first electrode 140 as a common layer so as to correspond to all the red sub pixel R, the green sub pixel G, and the blue sub pixel B.

The hole injecting layer 151 may serve to smoothly inject the holes and be formed of at least one of 1,4,5,8,9,11-hexaazatriphenylene-hexanitrile (HATCN), cupper phthalocyanine (CuPc), poly(3,4)-ethylenedioxythiophene (PEDOT), polyaniline (PANI), N,N-dinaphthyl-N,N'-diphenylbenzidine (NPD), N,N'-Bis(3-methylphenyl)-N,N"-bis(phenyl)-benzidine (TPD), Bis[N-(1-naphthyl)-N-phenyl]benzidine (α-NPB), 1,3,5-tris(4-diphenylaminophenyl)benzene (TDAPB), Tris(4-carbazoyl- 9-yl)triphenylamine (TCTA), 2,2',7,7"-Tetrakis(N,N-diphenylamino)-9,9-spirobifluorene (spiro-TAD), and 4,4'-bis(carbazol-9-yl)biphenyl (CBP), but is not limited thereto.

The hole injecting layer 151 may be formed by doping a p type dopant into a material which forms the first hole transporting layer 152a. In this case, the hole injecting layer 151 and the second hole transporting layer 152b may be formed by continuous processes in one processing equipment. The p type dopant may be formed of 2,3,5,6-tetrafluoro-7,7,8,8-tetracyano-quinidimethane (F4-TCNQ), but is not limited thereto.

The first hole transporting layer 152a is disposed on the hole injecting layer 151 as a common layer so as to correspond to all the red sub pixel R, the green sub pixel G, and the blue sub pixel B. The first hole transporting layer 152a serves to smoothly transport the holes. The first hole transporting layer 152a may be formed of at least one of N,N-dinaphthyl-N,N'-diphenylbenzidine (NPD), N,N'-bis-(3-methylphenyl)-N,N'-bis-(phenyl)-benzidine (TPD), 2,2',7,7"-Tetrakis(N,N-diphenylamino)-9,9-spirobifluorene (spiro-TAD), and 4,4',4"-Tris(N-3-methylphenyl-N-phenyl-amino)-triphenylamine (MTDATA), but is not limited thereto.

The second hole transporting layer 152b is disposed on the first hole transporting layer 152a of the red sub pixel R. Further, the third hole transporting layer 152c is disposed on the first hole transporting layer 152a of the green sub pixel G.

The second hole transporting layer 152b and the third hole transporting layer 152c serve to smoothly transmit holes from the hole injecting layer 151 to the red light emitting layer 153a and the green light emitting layer 153b, respectively.

Further, each of thicknesses of the second hole transporting layer 152b and the third hole transporting layer 152c forms an optical distance of a micro cavity. More specifically, each of thicknesses of the second hole transporting layer 152b and the third hole transporting layer 152c may be determined such that the red light emitting layer 153a forms a micro cavity structure between the first electrode 140 and the second electrode 160 and the green light emitting layer 153b forms a micro cavity structure between the first electrode 140 and the second electrode 160. Furthermore, the optical distance of the micro cavity is formed in the red sub pixel R and the green sub pixel G, to improve the efficiency of the organic light emitting display device 100.

The red light emitting layer 153a is disposed on the second hole transporting layer 152b of the red sub pixel R. The red light emitting layer 153a may include a light emitting material that emits red light and the light emitting material may be formed using a phosphorescent or a fluorescent material.

More specifically, the red light emitting layer 153a may include a host material including carbazole biphenyl (CBP) or 1,3-bis(carbazol-9-yl)benzene (mCP), and may be formed of a phosphorescent material including a dopant including any one or more of bis(2-benzo[b]thiophen-2-yl-pyridine) (acetylacetonate)iridium(III) (Ir(btp)2(acac)), bis(1-phenylisoquinoline)(acetylacetonate)iridium(III) (Ir(piq)2 (acac)), tris(1-phenylquinoline)iridium(III) (Ir(piq)3), and octaethylporphyrin platinum (PtOEP). Otherwise, the red light emitting layer 153a may be formed of a fluorescent material including PBD:Eu(DBM)3(Phen) or perylene, but is not limited thereto.

The green light emitting layer 153b is disposed on the third hole transporting layer 152c of the green sub pixel G. The green light emitting layer 153b may include a light emitting material that emits green light and the light emitting material may be formed using a phosphorescent or a fluorescent material.

More specifically, the green light emitting layer 153b may include a host material including CBP or mCP and may be formed of a phosphorescent material including a dopant material such as iridium complex including Ir(ppy)$_3$(tris(2-phenylpyridine)iridium(III)) or Ir(ppy)2(acaa)(bis(2-phenylpyridine)(acetylacetonate)iridium(III). Otherwise, the green light emitting layer 153b may include a fluorescent material including Alq3(tris(8-hydroxyquinolino)aluminum), but is not limited thereto.

The blue light emitting layer 153c is disposed on the first hole transporting layer 152a of the blue sub pixel B. The blue light emitting layer 153c may include a light emitting material that emits blue light and the light emitting material may be formed using a phosphorescent or a fluorescent material.

More specifically, the blue light emitting layer 153c may include a host material including CBP or mCP and may be formed of a phosphorescent material including a dopant material including FIrPic(bis(3,5,-difluoro-2-(2-pyridyl) phenyl-(2-carboxypyridyl)iridium(III)). Furthermore, the blue light emitting layer 153c may be formed of a fluorescent material including any one of DPVBi(4,4'-bis[4-di-p-tolylamino)stryl)biphenyl), DSA(1-4-di-[4-(N,N-di-phenyl) amino]styryl-benzene), PFO (polyfluorene) based polymers, and PPV (polyphenylenevinylene) based polymers, but is not limited thereto.

The electron transporting layer 154 is disposed on the red light emitting layer 153a, the green light emitting layer 153b, and the blue light emitting layer 153c so as to correspond to all the red sub pixel R, the green sub pixel G, and the blue sub pixel B.

The electron transporting layer 154 serves to transport and inject the electrons and a thickness of the electron transporting layer 154 may be adjusted in consideration of an electron transporting characteristic.

The electron transporting layer 154 serves to smoothly transport the electrons. The electron transporting layer 154 may be formed on any one or more of Lig(8-hydroxyquinolinato-lithium), Alq$_3$(tris(8-hydroxyquinolinato)aluminum), PBD(2-(4-biphenylyl)-5-(4-tert-butylpheny)-1,3,4oxadiazole), TAZ(3-(4-biphenyl)4-phenyl-5-tert-butylphenyl-1,2,4-triazole), spiro-PBD and BAlq(bis(2-methyl-8-quinolinolate)-4-(phenylphenolato)aluminium), but is not limited thereto.

Furthermore, the electron injecting layer (EIL) may be further provided on the electron transporting layer 154.

The electron injecting layer EIL may be formed of a metal inorganic compound such as $BaF_2$, LiF, NaCl, CsF, $Li_2O$, and BaO, but is not limited thereto.

The disclosed structure is not restricted according to the embodiment illustrated in FIG. 4, and at least one of the hole injecting layer 151, the first hole transporting layer 152a, the second hole transporting layer 152b, the third hole transporting layer 153c, and the electron transporting layer 154 may be omitted. Furthermore, any one of the hole injecting layer 151, the first hole transporting layer 152a, the second hole transporting layer 152b, the third hole transporting layer 153c, and the electron transporting layer 154 may be formed of two or more layers.

The second electrode 160 is disposed on the hole transporting layer 154 so as to correspond to all the red sub pixel R, the green sub pixel G, and the blue sub pixel B.

A capping layer may be disposed on the second electrode 160. The capping layer is provided to improve a light extracting effect of the organic light emitting display device and may be formed of any one of host materials of the first hole transporting layer 152a, the electron transporting layer 154, the red light emitting layer 153a, the green light emitting layer 153b, and the blue light emitting layer 153c. Furthermore, the capping layer may be omitted in accordance with the structure or the characteristic of the organic light emitting display device 100.

The organic light emitting layer 153 of the organic light emitting display device 100 may be configured to include at least one phosphorescent material. More specifically, the organic light emitting layer 153 may be configured to include the red light emitting layer 153a which is disposed in the red sub pixel R to emit red light, the green light emitting layer 153b which is disposed in the green sub pixel G to emit green light, and the blue light emitting layer 153c which is disposed in the blue sub pixel B to emit blue light. Here, the red light emitting layer 153a includes a phosphorescent material and the green light emitting layer 153b and the blue light emitting layer 153c include a fluorescent material. Alternatively, the red light emitting layer 153a and the green light emitting layer 153b include a phosphorescent material and the blue light emitting layer 153c includes a fluorescent material. All the red light emitting layer 153a, the green light emitting layer 153b, and the blue light emitting layer 153c may include a phosphorescent material.

The organic light emitting display device 100 may be applied to display devices including such as a TV, a mobile phone, a tablet PC, a monitor, a laptop computer, an automotive display device, and an automotive lighting device. Alternatively, the organic light emitting display device 100 may also be applied to a wearable display device, a foldable display device, a bendable display device, a rollable display device, and the like.

Figure 5:
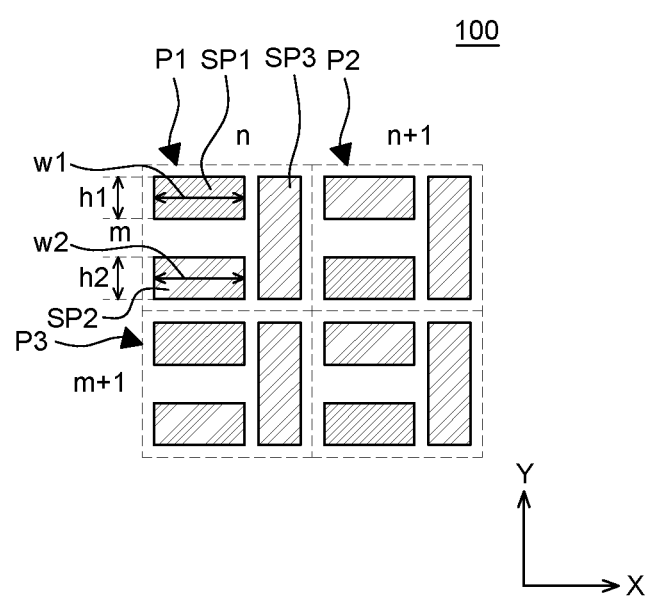
FIG. 5 is a view illustrating a planar structure of a sub pixel of an organic light emitting display device according to an embodiment of the present disclosure.

FIG. 5 is a view illustrating a planar structure of a sub pixel of an organic light emitting display device according to an embodiment of the present disclosure.

The first sub pixel SP1, the second sub pixel SP2, and the third sub pixel SP3 which form each pixel may have a rectangular shape with a long side and a short side.

The first sub pixel SP1 of the first pixel P1 may be formed to have a width w1 in the first direction X and a height h1 in the second direction Y. Furthermore, the second sub pixel SP2 of the first pixel P1 may be formed to have a width w2 in the first direction X and a height h2 in the second direction Y.

Sizes of the first sub pixel SP1, the second sub pixel SP2, and the third sub pixel SP3, that is, the length in the first direction X and the length in the second direction Y may be set in consideration of color characteristics required in the organic light emitting display device.

More specifically, the lengths of the first sub pixel SP1 and the second sub pixel SP2 in the first direction X which is the horizontal direction may be formed in the range of 8 μm to 33 μm. Further, the lengths of the first sub pixel SP1 and the second sub pixel SP2 in the second direction Y which is the vertical direction may be formed in the range of 9 μm to 21 μm.

When the lengths of the first sub pixel SP1 and the second sub pixel SP2 is increased in order to set the lengths of the first sub pixel SP1 and the second sub pixel SP2, an asymmetry phenomenon of the color coordinate according to the viewing angle may be reduced. Therefore, the lengths of the first sub pixel SP1 and the second sub pixel SP2 may be set in consideration thereof. This will be described below with reference to FIG. 8.

Furthermore, in the case of the organic light emitting display device 100, the first sub pixel SP1 and the second sub pixel SP2 may be formed to have the same lengths in the first direction X and the second direction Y.

That is, the width w1 of the first sub pixel SP1 of the first pixel P1 may be equal to the width w2 of the second sub pixel SP2 and the height h1 of the first sub pixel SP1 of the first pixel P1 may be equal to the height h2 of the second sub pixel SP2.

When the first sub pixel SP1 and the second sub pixel SP2 of the organic light emitting display device 100 are formed to have the same length, the lengths of the first sub pixel SP1 and the second sub pixel SP2 of each pixel P1 and P2 in the first direction X which is the horizontal direction may be formed in the range of 25 μm to 33 μm.

Furthermore, when the first sub pixel SP1 and the second sub pixel SP2 are formed to have the same length, the lengths of the first sub pixel SP1 and the second sub pixel SP2 of each pixel P1 and P2 in the second direction Y which is the vertical direction may be formed in the range of 15 μm to 21 μm.

That is, in the organic light emitting display device 100, the lengths of the first sub pixel SP1 and the second sub pixel SP2 in the first direction X are formed in the range of 25 μm to 33 μm. Further, the lengths of the first sub pixel SP1 and the second sub pixel SP2 in the second direction Y are formed in the range of 15 μm to 21 μm. Therefore, the lengths of the first sub pixel SP1 and the second sub pixel SP2 may be increased as compared with the related art. Therefore, the color sense variation between the plurality of pixels P1 and P2 is reduced and thus the color coordinate asymmetry phenomenon according to the viewing angle is reduced and thus the image quality of the organic light emitting display device may be improved.

As described above, the organic light emitting display device 100 includes a substrate including a pixel array and pixels formed of at least three sub pixels in the pixel array. Among three sub pixels, a blue sub pixel extends in a column direction which is a vertical direction and a red sub pixel and a green sub pixel extend in a row direction which is a horizontal direction to be vertically disposed at the side of the blue sub pixel. An anode of the red sub pixel has a first slope with respect to the substrate, an anode of the green sub pixel has a second slope with respect to the substrate and the pixel array is implemented as an anode tilt symmetrization (ATS) pixel structure, thereby improving the asymmetric color coordinate problem according to the viewing angle. The slope or tilting of the anodes is caused by a difference in the height of the planarization due to the presence of a TFT in the sub pixel. The direction of the slope or tilting can be controlled relatively easily by the shifting the position of the TFT.

Furthermore, in the organic light emitting display device 100, the anode tilt symmetrization (ATS) pixel structure may be implemented by applying at least one condition of a specific arrangement condition and a specific length condition of the sub pixels.

That is, in the organic light emitting display device 100, according to the specific arrangement condition of the anode tilt symmetrization (ATS) pixel structure, all pixels have the same sub pixel arrangement in each column and the red sub pixel and the green sub pixel of adjacent pixels in each row may be alternately disposed to have different slopes of the anodes.

Furthermore, in the organic light emitting display device 100, according to the specific length condition of the anode tilt symmetrization (ATS) pixel structure, the length of the red sub pixel and the green sub pixel in a row direction which is a horizontal direction may be formed in the range of 25 µm to 33 µm. Furthermore, the length of the red sub pixel and the green sub pixel in a column direction which is a vertical direction may be formed in the range of 15 µm to 21 µm.

Figure 6:
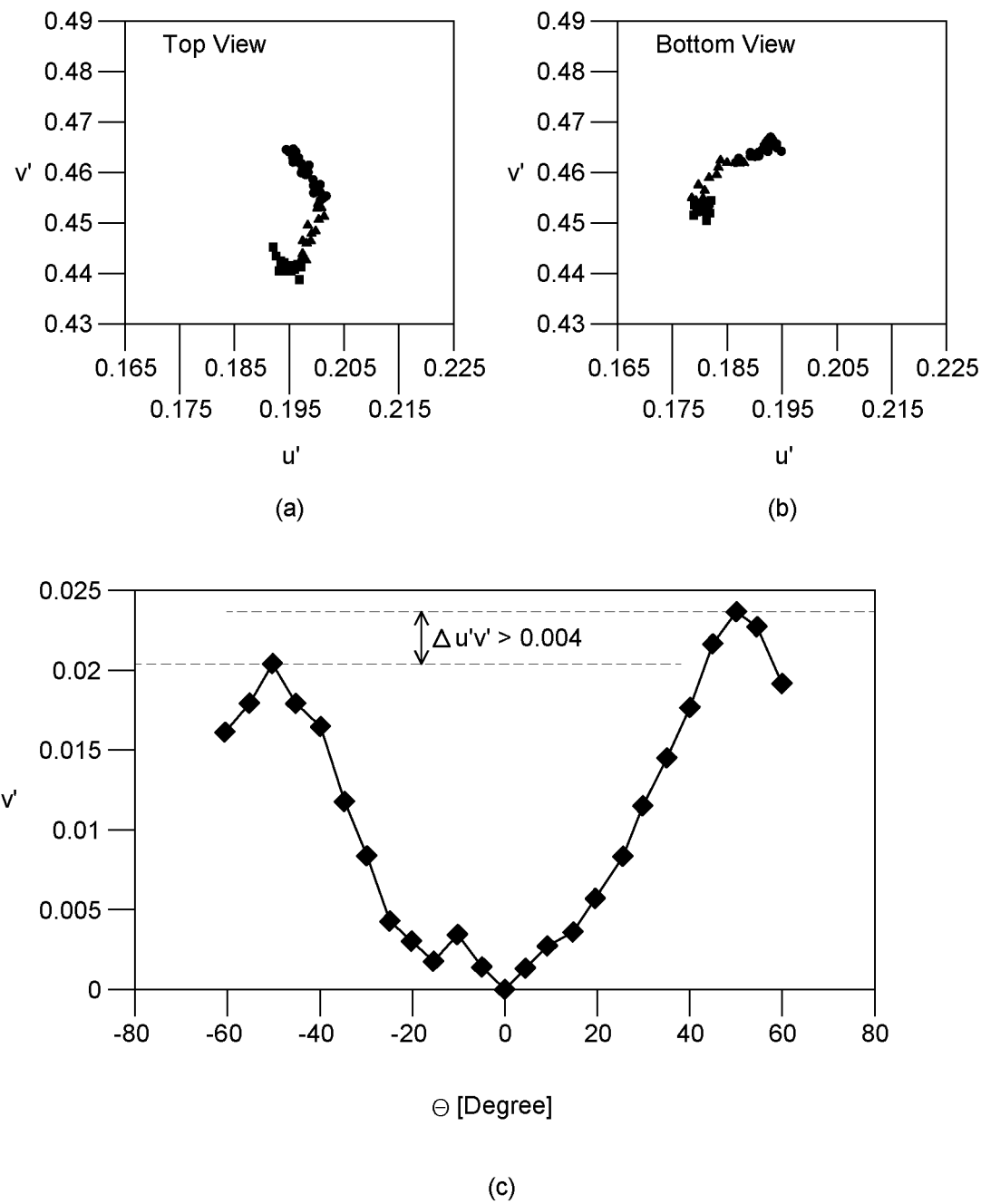
FIG. 6 is a view illustrating a color coordinate variation level according to a viewing angle of an organic light emitting display device according to a comparative embodiment.

FIG. 6 is a view illustrating a color coordinate variation level according to a viewing angle of an organic light emitting display device according to a comparative embodiment.

An organic light emitting display device of the related art according to a comparative embodiment has a structure in which sub pixels configured in a plurality of adjacent pixels are disposed in the same position.

FIG. 6A is a graph illustrating a variation of a color coordinate (u'v') when the organic light emitting display device of the related art is viewed while changing the viewing angle from the front to the top and FIG. 6B is a graph illustrating a variation of a color coordinate (u'v') when the organic light emitting display device of the related art is viewed while changing the viewing angle from the front to the bottom.

Referring to FIG. 6A, it is understood that when the organic light emitting display device of the related art is viewed by changing the viewing angle from the front to the top, a reddish phenomenon in which white is slightly tinged with red is generated when the color coordinate (u'v') moves from the center of the graph to a right lower direction according to the change of the viewing angle.

Referring to FIG. 6B, it is understood that when the organic light emitting display device of the related art is viewed by changing the viewing angle from the front to the bottom, a greenish phenomenon in which white is slightly tinged with green is generated when the color coordinate (u'v') moves from the center of the graph to a left upper direction according to the change of the viewing angle.

FIG. 6C is a graph illustrating a color coordinate variation (Δu'v') according to the change of the viewing angle from the bottom to the top of the front of the organic light emitting display device of the related art. In FIG. 6C, a horizontal axis of the graph represents a viewing angle θ and a vertical axis represents a color coordinate variation (Δu'v'). Here, a right side, an upper side, a left side, and a bottom side of the viewing angle θ at which the organic light emitting display device is viewed may be represented by azimuthal angles of 0 degree, 90 degrees, 180 degrees, and 270 degrees. The color coordinate variation (Δu'v') refers to a difference of a color coordinate when the organic light emitting display device is viewed at the front and a color coordinate when the organic light emitting display device is viewed at the viewing angle. The viewing angle measured in this evaluation is −60 degrees to 60 degrees and measured at an interval of 1 degree from a starting position.

It is understood that the difference between a color coordinate variation (Δu'v') when the organic light emitting display device of the related art is viewed at −60 degrees which is a lower direction (bottom) from the front and a color coordinate variation (Δu'v') when the organic light emitting display device of the related art is viewed at 60 degrees which is an upper direction (top) from the front is approximately 0.004 or higher. Further, in the organic light emitting display device of the related art, the color coordinate irregularity may be generated according to the upper and lower viewing angles.

Figure 7:
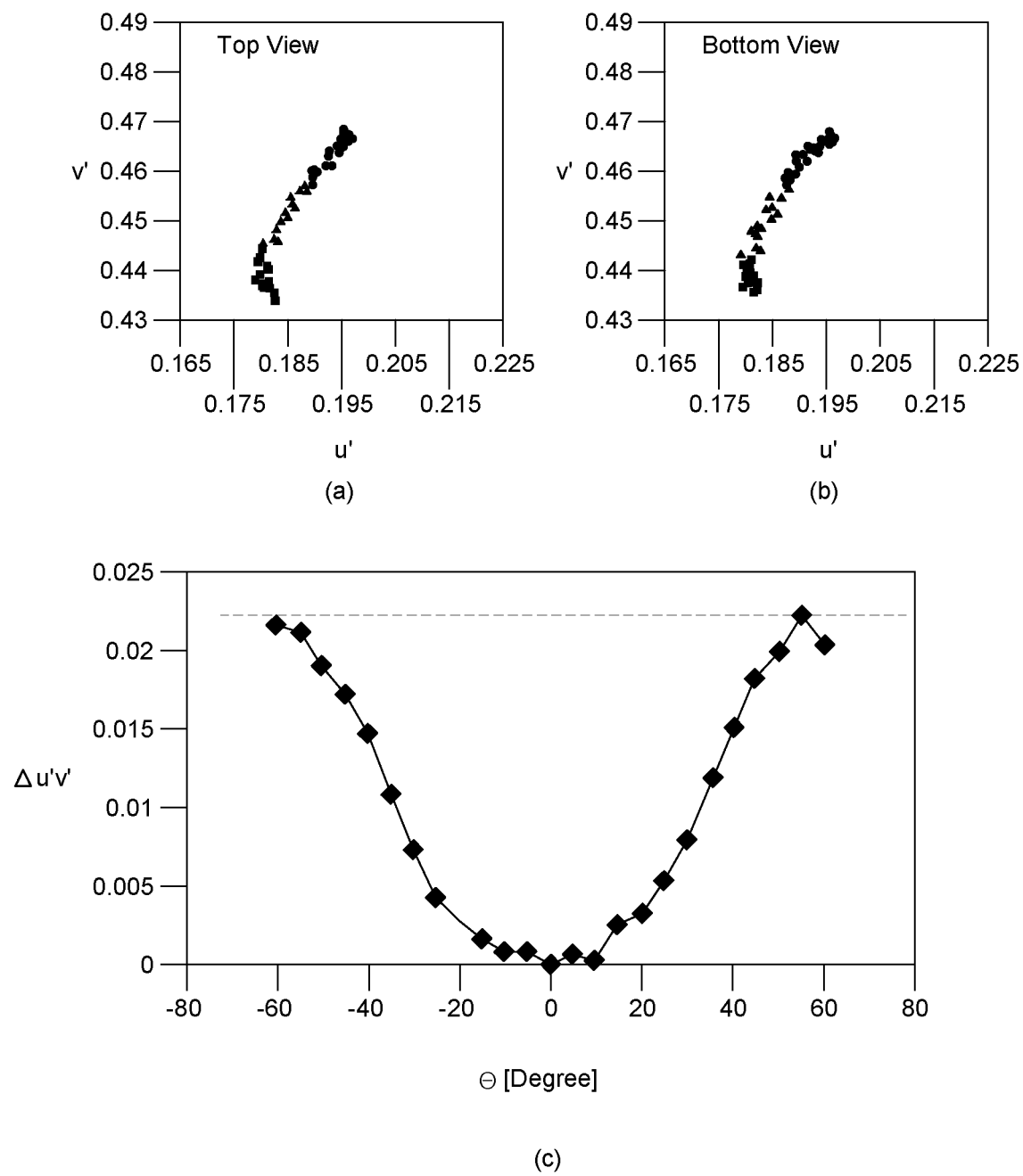
FIG. 7 is a view illustrating a color coordinate variation level according to a viewing angle of an organic light emitting display device according to an embodiment of the present disclosure.

FIG. 7 is a view illustrating a color coordinate variation level according to a viewing angle of an organic light emitting display device according to an embodiment of the present disclosure.

The organic light emitting display device 100 has a structure in which the first sub pixels SP1 and the second sub pixels SP2 of the first pixel P1 and the second pixel P2 which are adjacent to each other in the first direction which is a horizontal direction display different colors and the first electrodes 140 of the first sub pixel SP1 and the second sub pixel SP2 have different angles with respect to the substrate 110.

FIG. 7A is a graph illustrating a variation of a color coordinate (u'v') when the organic light emitting display device 100 is viewed while changing the viewing angle from the front to the top and FIG. 7B is a graph illustrating a variation of a color coordinate (u'v') when the organic light emitting display device according to the embodiment of the present disclosure is viewed while changing the viewing angle from the front to the bottom.

Referring to FIG. 7A, it is understood that when the organic light emitting display device 100 is viewed while changing the viewing angle from the front to the top, the color coordinate (u'v') represents white in which a reddish phenomenon is minimized as compared with the comparative embodiment described with reference to FIG. 6A while moving from the center of the graph to a left lower direction according to the change of the viewing angle.

Further, referring to FIG. 7B, it is understood that when the organic light emitting display device 100 is viewed while changing the viewing angle from the front to the bottom, the color coordinate (u'v') represents white in which a greenish phenomenon is minimized as compared with the comparative embodiment described with reference to FIG. 6B while moving from the center of the graph to a left lower direction according to the change of the viewing angle.

FIG. 7C is a graph illustrating a color coordinate variation (Δu'v') according to the change of the viewing angle from the bottom to the top of the front of the organic light emitting display device 100.

The difference between a color coordinate variation (Δu'v') when the organic light emitting display device 100 is viewed at −60 degrees which is the lower (bottom) direction from the front to the bottom and a color coordinate variation (Δu'v') when the organic light emitting display device 100 is viewed at 60 degrees which is the upper (top) direction from the front is approximately same. Furthermore, it is understood that in the organic light emitting display device 100, the color coordinate irregularity phenomenon is reduced according to the upper and lower viewing angles as compared with the comparative embodiment described with reference to FIG. 6C.

That is, in the organic light emitting display device 100, the angle formed by the first electrode 140 and the substrate 110 in the first sub pixel SP1 of the first pixel P1 is different from the angle formed by the first electrode 140 and the substrate 110 in the first sub pixel SP1 of the second pixel P2 which is adjacent to the first pixel in a horizontal direction, so that a variation of the color coordinate according to the viewing angle may be reduced as compared with the organic light emitting display device of the related art.

Furthermore, according to the organic light emitting display device 100, first sub pixels SP1 and second sub pixels SP2 of two adjacent pixels P1 and P2 are disposed to display different colors so that a color coordinate asymmetry phenomenon according to the viewing angle may be reduced and an image quality of the organic light emitting display device may be improved.

Figure 8:
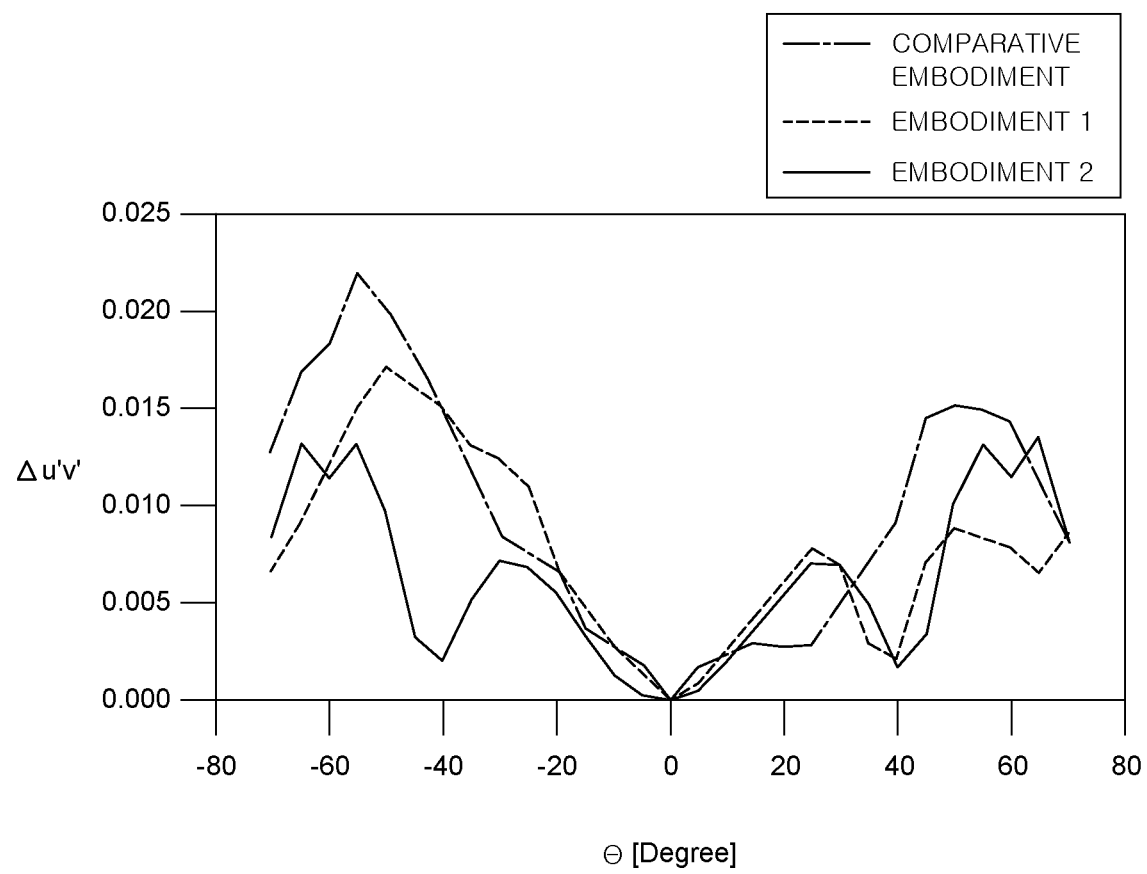
FIG. 8 is a view illustrating a color coordinate variation level according to a viewing angle when a size of a sub pixel of an organic light emitting display device according to a comparative embodiment and an exemplary embodiment of the present disclosure varies.

FIG. 8 is a view illustrating a color coordinate variation level according to a viewing angle when a length of a sub pixel of an organic light emitting display device according to a comparative embodiment and an embodiment of the present disclosure varies.

That is, FIG. 8 is a graph obtained by comparing color coordinate variations (Δu'v') according to the change of the viewing angle from the bottom to the top of the front of the organic light emitting display device 100 and the organic light emitting display device of the comparative embodiment.

An organic light emitting display device of the related art according to a comparative embodiment of FIG. 8 has a structure in which sub pixels configured in a plurality of adjacent pixels are disposed in the same position.

Furthermore, a first embodiment (embodiment 1) of the present disclosure has the same pixel structure as the comparative embodiment and the area of the first sub pixel SP1 and the second sub pixel SP2 is increased by approximately 2% as compared with the comparative embodiment.

Further, a second embodiment (embodiment 2) of the present disclosure has a structure in which the first sub pixels SP1 and the second sub pixels SP2 of the first pixel P1 and the second pixel P2 which are adjacent to each other in the first direction which is a horizontal direction display different colors and the first electrodes 140 of the first sub pixel SP1 and the second sub pixel SP2 have different angles with respect to the substrate 110. Furthermore, the area of the first sub pixel SP1 and the second sub pixel SP2 is increased by approximately 4% as compared with the comparative embodiment.

When the comparative embodiment is examined with reference to FIG. 8, the difference of the color coordinate variation (Δu'v') when it is viewed at −60 degrees which is the lower (bottom) direction from the front and the color coordinate variation (Δu'v') when it is viewed at 60 degrees which is the upper (top) direction from the front is large. Therefore, the color coordinate irregularity phenomenon is generated according to the upper and lower viewing angles. In contrast, in the case of the embodiment 1 and the embodiment 2, it is understood that the difference of the color coordinate variation (Δu'v') when it is viewed at −60 degrees which is the lower (bottom) direction from the front and the color coordinate variation (Δu'v') when it is viewed at 60 degrees which is the upper (top) direction from the front is gradually reduced as compared with the comparative embodiment. That is, as compared with the comparative embodiment, it is understood that in the first embodiment and the second embodiment, as the areas of the first sub pixel SP1 and the second sub pixel SP2, that is, the lengths of the first sub pixel SP1 and the second sub pixel SP2 are increased, the irregularity of the color coordinate according to the upper and lower viewing angles is reduced.

Furthermore, in the second embodiment, as compared with the first embodiment having a pixel arrangement structure of the related art, the first sub pixels SP1 and the second sub pixels SP2 of the first pixel P1 and the second pixel P2 which are adjacent to each other in the first direction which is a horizontal direction display different colors. Further, the first electrodes 140 of the first sub pixel SP1 and the second sub pixel SP2 are formed to have different angles with respect to the substrate 110. Therefore, it is understood that the irregularity phenomenon of the color coordinate according to the upper and lower viewing angles is reduced.

That is, in the organic light emitting display device 100, the angle formed by the first electrode 140 and the substrate 110 in the first sub pixel SP1 of the first pixel P1 is different from the angle formed by the first electrode 140 and the substrate 110 in the first sub pixel SP1 of the second pixel P2 which is adjacent to the first pixel in a horizontal direction, so that a variation of the color coordinate according to the viewing angle may be minimized as compared with the organic light emitting display device of the related art.

Furthermore, according to the organic light emitting display device 100, first sub pixels SP1 and second sub pixels SP2 of two adjacent pixels P1 and P2 are disposed to display different colors so that a color coordinate asymmetry phenomenon according to the viewing angle may be reduced and an image quality of the organic light emitting display device may be improved.

Although embodiments described above are directed to organic light emitting display devices, same principles can be applied to other light emitting display devices such as quantum dot light emitting diode (QLED) display devices.

What is claimed is:

1. A light emitting display device, comprising:
a first pixel on a substrate comprising:
a first sub pixel extending in a horizontal direction, the first sub pixel including:
a first sub pixel thin film transistor (TFT) disposed at a first side of an active area of the first sub pixel, and
a first sub electrode coupled to the first sub pixel TFT, the first sub electrode having a first slope with respect to the substrate in an emission area of the first sub pixel,
wherein the first sub electrode is disposed over the first sub pixel TFT, from the first side of the active area of the first sub pixel to a second side of the active area of the first sub pixel, wherein the second side of the active area of the first sub pixel is opposite to the first side of the active area of the first sub pixel along a vertical direction, and
wherein a distance between the first sub electrode and the substrate at the first side of the active area of the first sub pixel over the first sub pixel TFT is greater than a distance between the first sub electrode and the substrate at the second side of the active area of the first sub pixel,
a second sub pixel extending in the horizontal direction, the second sub pixel next to the first sub pixel in the vertical direction, the second sub pixel including:
a second sub pixel TFT disposed at a second side of the active area of the second sub pixel, and
a second sub electrode coupled to the second sub pixel TFT, the second sub electrode having a second slope with respect to the substrate in an emission area of the second sub pixel, the second slope having a tilting direction opposite to the first slope,
wherein the second sub electrode is disposed over the second sub pixel TFT, from the second side of the active area of the second sub pixel to a first side of the active area of the second sub pixel,
wherein the second side of the active area of the second sub pixel is opposite to the first side of the active area of the second sub pixel along the vertical direction, and wherein a distance between the second sub electrode and the substrate at the second side of the active area of the second sub pixel over the second sub pixel TFT is greater than a distance between the second sub electrode and the substrate at the first side of the active area of the second sub pixel, and a third sub pixel extending in the vertical direction, third sub pixel including a third sub electrode coupled to a third sub pixel TFT; and a second pixel on the substrate and adjacent to the first pixel in the horizontal direction, the second pixel comprising:

a fourth sub pixel extending in the horizontal direction, the fourth sub pixel including:

a fourth sub pixel TFT disposed at a second side of an active area of the fourth sub pixel, and a fourth sub electrode coupled to the fourth sub pixel TFT, the fourth sub electrode having the second slope with respect to the substrate in an emission area of the fourth sub pixel, the second slope having the tilting direction opposite to the first slope, wherein the fourth sub electrode is disposed over the fourth sub pixel TFT, from the second side of the active area of the fourth sub pixel to a first side of the active area of the fourth sub pixel, wherein the second side of the active area of the fourth sub pixel is opposite to the first side of the active area of the fourth sub pixel along the vertical direction, wherein a distance between the fourth sub electrode and the substrate at the second side of the active area of the fourth sub pixel over the fourth sub pixel TFT is greater than a distance between the fourth sub electrode and the substrate at the first side of the active area of the fourth sub pixel, and wherein the first sub pixel and the fourth sub pixel display different colors, a fifth sub pixel extending in a horizontal direction, the fifth sub pixel next to the fourth sub pixel in the vertical direction, the fifth sub pixel including:

a fifth sub pixel TFT disposed at a first side of an active area of the fifth sub pixel, and a fifth sub electrode coupled to the fifth sub pixel TFT, the fifth sub electrode having the first slope with respect to the substrate in an emission area of the fifth sub pixel, wherein the fifth sub electrode is disposed over the fifth sub pixel TFT, from the first side of the active area of the fifth sub pixel to a second side of the active area of the fifth sub pixel, wherein the second side of the active area of the fifth sub pixel is opposite to the first side of the active area of the fifth sub pixel along a vertical direction, and wherein a distance between the fifth sub electrode and the substrate at the first side of the active area of the fifth sub pixel over the fifth sub pixel TFT is greater than a distance between the fifth sub electrode and the substrate at the second side of the active area of the fifth sub pixel, and wherein the first sub pixel and the fifth sub pixel display the same color, wherein the tilting direction is in the vertical direction.

2. The light emitting display device of claim 1 wherein the first sub pixel is formed in a left upper side of the first pixel, the second sub pixel is formed in a left lower side of the first pixel, and the third sub pixel is formed in a right side of the first pixel.

3. The light emitting display device of claim 1, wherein the first pixel and the second pixel form one pixel group and the pixel group repeatedly disposed in the horizontal direction and the vertical direction.

4. The light emitting display device of claim 1, wherein the first sub pixel is a red sub pixel including a red light emitting layer, the second sub pixel is a green sub pixel including a green light emitting layer, and the third sub pixel is a blue sub pixel including a blue light emitting layer.

5. The light emitting display device of claim 1, wherein lengths in the horizontal direction of the first sub pixel and the second sub pixel and lengths in the vertical direction of the first sub pixel and the second sub pixel are equal to each other.

* * * * *